(12) United States Patent
Miki et al.

(10) Patent No.: US 6,700,423 B1
(45) Date of Patent: Mar. 2, 2004

(54) PULSE WIDTH CONTROL CIRCUIT CONTROLLING PULSE WIDTH OF OUTPUT LIGHT

(75) Inventors: Makoto Miki, Sapporo (JP); Toru Matsuyama, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/342,251

(22) Filed: Jan. 15, 2003

Related U.S. Application Data

(63) Continuation of application No. PCT/JP00/07519, filed on Oct. 26, 2000.

(51) Int. Cl.$^7$ .............................................. H03K 3/017
(52) U.S. Cl. ........................................ 327/172; 327/291
(58) Field of Search .......................... 327/172, 173–175, 327/176, 291, 299; 375/238

(56) References Cited

U.S. PATENT DOCUMENTS

| | | | | |
|---|---|---|---|---|
| 5,081,380 A | * | 1/1992 | Chen | 327/262 |
| 5,180,995 A | * | 1/1993 | Hayashi et al. | 331/57 |
| 5,994,937 A | * | 11/1999 | Hara et al. | 327/262 |
| 6,169,765 B1 | * | 1/2001 | Holcombe | 375/238 |
| 6,462,598 B1 | * | 10/2002 | Okayasu et al. | 327/276 |

FOREIGN PATENT DOCUMENTS

| | | |
|---|---|---|
| JP | 62-30433 | 2/1987 |
| JP | 01-314013 | 12/1989 |
| JP | 2539667 | 1/1990 |
| JP | 2864596 | 8/1991 |
| JP | 10-242915 | 9/1998 |
| JP | 11-330952 | 11/1999 |
| JP | 11-340927 | 12/1999 |
| JP | 2000-13204 | 1/2000 |

* cited by examiner

Primary Examiner—Minh Nguyen
(74) Attorney, Agent, or Firm—Staas & Halsey LLP

(57) ABSTRACT

A circuit for controlling pulse width of a signal for driving a light emitting element, includes a pulse width control circuit capable of responding to multi-bit rates in the same circuit structure. For this purpose, the pulse width control circuit has a Tr/Tf control section controlling at least one of a rise time Tr and a fall time Tf of an input signal according to the bit rate of the input signal; a waveform shaping section shaping a signal output from the Tr/Tf control section to generate an output signal; and a control signal generating section generating a control signal for controlling an operation of the Tr/Tf control section based on pulse width control information.

5 Claims, 13 Drawing Sheets

(a)

(b)

CONVENTIONAL PULSE WIDTH CONTROL CIRCUIT

OPERATION OF CONVENTIONAL PULSE WIDTH CONTROL CIRCUIT

PULSE WIDTH CONTROL CIRCUIT CONTROLLING PULSE WIDTH OF OUTPUT LIGHT

This application is a continue of PCT/JP00/07519 filed Oct. 26, 2000.

FIELD OF THE INVENTION

The present invention relates to a circuit for driving light emitting elements, for example, semiconductor lasers (laser diodes: LDs), light-emitting diodes (LEDs) and the like, in the field of optical communications and the like, and in particular, to a pulse width control circuit for controlling pulse width of output light.

TECHNICAL BACKGROUND

Generally, when modulating an LD at a high speed, pulse width of optical output waveform is narrower compared to that of an LD drive current waveform, due to turn-on delay in the LD. In particular, when non-bias modulating an LD, since there may be a turn-on delay time of about 1 nsec or more, depending on the type of LD, with a rise in bit rate, such a value cannot be ignored with respect to mask registration. This turn-on delay time Td can typically be expressed by the following equation (1), provided that a carrier lifespan is τs, an LD drive current is If, a bias current is Ib, and an LD threshold current is Ith.

$$Td = \tau S \times ln[(If-Ib)/(If-Ith)] \quad (1)$$

From the above equation (1), it can be understood that the turn-on delay time Td fluctuates according to the LD drive current If, the bias current Ib, and the LD threshold current Ith. Also, in the turn-on delay time Td, there is an individual difference due to connection variation in the assembly of the LD optical system. Further, even if an LD is decided, since there is a change in the turn-on delay time Td due to temperature fluctuation, pulse width fluctuation in an LD light output waveform is caused. Consequently, a control circuit is required for the purpose of suppressing pulse width fluctuation in the LD light output waveform due to temperature fluctuation and the like.

FIG. 13 is a circuit diagram showing a structural example of a conventional pulse width control circuit.

In FIG. 13, the conventional pulse width control circuit comprises a Tr/Tf control section that controls a rise time Tr and a fall time Tf of an input data signal DATA_IN, and a waveform shaping section that waveform shapes a signal from the Tr/Tf control section to output an output signal DATA_OUT for driving an LD.

In this conventional circuit, as shown in FIG. 14, in the Tr/Tf control section, the rise time Tr of the input signal DATA_IN is restricted by a time constant determined by a constant current source I11 and capacity C11, and the fall time Tf of the input signal DATA_IN is restricted by a time constant determined by a constant current source I12 and the capacity C11 (refer to a voltage waveform at point BB). Then, in the waveform shaping section, the output signal from the Tr/Tf control section and a threshold voltage (refer to a voltage waveform at point CC) set according to pulse width control information supplied from the exterior are compared with each other, so that the output signal DATA_OUT whose pulse width is controlled is generated to be output. Here, as shown on the left side of FIG. 14, the threshold voltage is set to be high, so that the output signal DATA_OUT with a narrow pulse width is output. As shown on the right side of FIG. 14, the threshold voltage is set to be low, so that the output signal DATA_OUT with a broad pulse width is output.

An LD drive circuit is connected to a latter stage of the conventional pulse width control circuit shown in FIG. 13. In the LD drive circuit, an LD drive current is controlled in accordance with the output signal DATA_OUT of the pulse width control circuit. As a result, pulse width control information that brings pulse width of an LD light output waveform to a desired value is sent to the pulse width control circuit, and the threshold voltage is set according to the pulse width control information to set pulse width of an optical output.

However, in the conventional pulse width control circuit as described above, the input signal DATA_IN is band restricted by the Tr/Tf control section so that the rise and fall time constants are always constant, and then, compared with the threshold value controllable from the exterior, so that the pulse width of the output signal DATA_OUT is controlled. Therefore, there is a problem that it is difficult to respond to multi-bit rate of data signals.

In other words, as shown on the left side of FIG. 15 for example, in the case where the time constant of the Tr/Tf control section is set to correspond to a bit rate f, if this is made to correspond to a four times bit rate 4f, the rise time is changed due to the state of previous bits, as shown in the voltage waveform at point BB in the lower part of the figure, and a pattern effect is generated in the output signal DATA_OUT. In the example of the figure, there occurs a pattern effect such that each pulse rise delay time becomes t1=t2<t3. On the other hand, as shown on the right of FIG. 15, in the case where the time constant of the Tr/Tf control section is set to correspond to the fast bit rate 4f, if this is made to correspond to the bit rate f, an adjustment range of the pulse width controllable according to the setting of threshold voltage becomes narrower, causing a possibility that a desired pulse width cannot be realized.

Also, in the conventional pulse width control circuit, there is a disadvantage that it is easily affected by noise or power source voltage fluctuation. In other words, as shown in FIG. 16 for example, in the case where the pulse width is set to be wide, it is necessary to set the threshold voltage of a comparator of the waveform shaping section to be low. Consequently, the waveform shaping section results in a circuit that is liable to be affected by ground (GND) noise and the like, to easily cause pulse width fluctuation or the pattern jitters. Note, if polarity of the circuit shown in FIG. 13 is reversed, the waveform shaping section results in a circuit that is liable to be affected by power source noise. In addition, the Tr/Tf control section has a circuit structure that is liable to be affected by power source noise or ground noise, irrespective of a set value of the pulse width, since it operates in a state where the band thereof is always lowered.

Further, in the conventional pulse width control circuit, in order to set the pulse width of the output signal DATA_OUT to be wider, 100% or more, than the pulse width of the input signal DATA_IN, it is necessary to restrict the band of the fall time Tf for the input signal DATA_IN. However, as shown in FIG. 17 for example, if power source voltage fluctuation occurs, there is a difference in the time taken for the voltage at point BB to change from a low level to a high level and to reach the low level again, and since this signal is compared with the direct current threshold voltage in the waveform shaping section at the latter stage, as a result, the pulse width fluctuation is caused by the power source voltage fluctuation. Also, in the case where the polarity of the circuit shown in FIG. 13 is reversed, there is caused the same problem as in the case described above when the pulse width is set to be narrow,.

The present invention has been accomplished in view of the above problems, and has an object to provide a pulse width control circuit capable of responding to multi-bit rates with the same circuit structure. Also, the present invention has a further object to provide a pulse width control circuit that has excellent noise resistance and is not liable to be affected by power source voltage fluctuation.

DISCLOSURE OF THE INVENTION

In order to achieve the above objects, a pulse width control circuit of the present invention, for controlling pulse width of an input signal based on pulse width control information, and generating an output signal for driving a light emitting element, comprises: a rise/fall control section controlling at least one of a rise time and a fall time of the input signal according to a bit rate of the input signal; a waveform shaping section shaping a signal output from the rise/fall control section, to generate the output signal; and a control signal generating section generating a control signal for controlling an operation of the rise/fall control section based on the pulse width control information.

According to the above constitution, one or both of the rise time and fall time of the input signal is controlled, according to the bit rate of the input signal, by the rise/fall control section whose operation is controlled in accordance the control signal from the control signal generating section, and the signal output from the rise/fall control section is shaped by the waveform shaping section, so that the pulse width of the output signal for driving the light emitting element is controlled. Thus, it becomes possible to respond to multi-bit rates, since basically, the pulse width is not controlled by changing the threshold voltage of the waveform shaping section as in the conventional pulse width control circuit, but is controlled by adjusting the rise time and fall time of the input signal according to the bit rate.

Further, in the above pulse width control circuit, the specific constitution of the rise/fall control section may comprise: a current source controlled in accordance with the control signal from the control signal generating section; a bit detection element detecting a level of each bit indicated by the input signal; and an integrating element determining rise and fall time constants of the input signal based on a current supplied from the current source and detection results from the bit detection element.

In the rise/fall control section of the above constitution, the input signal is sent to the bit detection element so that the level of each bit is detected, and also the control signal from the control signal generating section is sent to the current source so that a current value to be supplied to the integrating element is controlled. Then, in the integrating element, the rise and fall time constants of the input signal are determined based on the current from the current source and the detection results of the bit detection element, so that a signal having a rise time and a fall time corresponding to the bit rate of the input signal is generated.

PREFERRED EMBODIMENTS OF THE INVENTION

Figure 1:
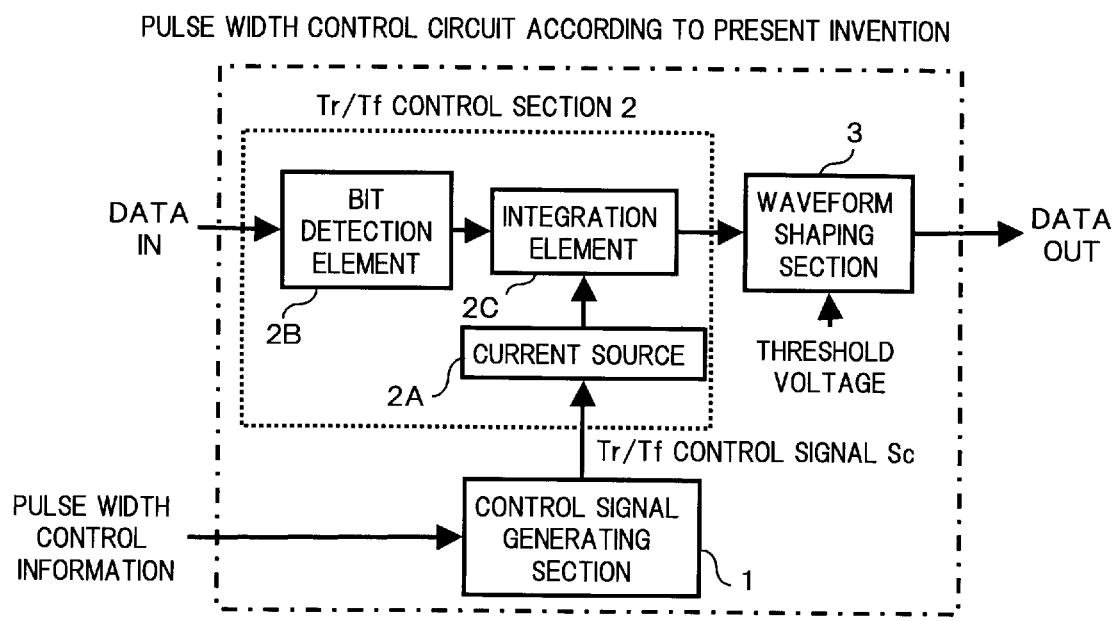
FIG. 1 is a block diagram showing a basic structure of a pulse width control circuit of the present invention.

A pulse width control circuit according to the present invention will be described hereafter based on the attached drawings. Note, the same reference numerals indicate the same or corresponding components throughout the drawings.

Firstly, a basic principle of the pulse width control circuit according to the present invention will be described.

FIG. 1 is a block drawing showing a basic structure of the pulse width control circuit of the present invention.

In FIG. 1, the basic structure of the pulse width control circuit comprises a control signal generating section 1 generating a Tr/Tf control signal Sc for controlling pulse width of an input signal DATA_IN according to pulse width control information, a Tr/Tf control section 2 controlling one or both of a rise time Tr and a fall time Tf of the input signal DATA_IN according to the Tr/Tf control signal Sc, and a waveform shaping section 3 shaping a signal from the Tr/Tf control section 2 to output an output signal DATA_OUT.

Further, the Tr/Tf control section 2 includes a current source 2A, a bit detection element 2B and an integrating element 2C. The current source 2A generates a constant current in accordance with the Tr/Tf control signal Sc sent from the control signal generating section 1, to supply the constant current to the integrating element 2C. The bit detection element 2B is a circuit that detects whether each bit shown by the input signal DATA_IN is "HI" or "LOW", and transmits a detection result to the integrating element 2C. The integrating circuit 2C is a circuit that determines rise and fall time constants of the input signal DATA_IN based on the detection result of the bit detection element 2B and the constant current supplied from the current source 2A. An output signal of the integrating circuit 2C is sent to the waveform shaping section 3.

Next, an operating principle of the pulse width control circuit having the basic structure as described above will be described.

Figure 2:
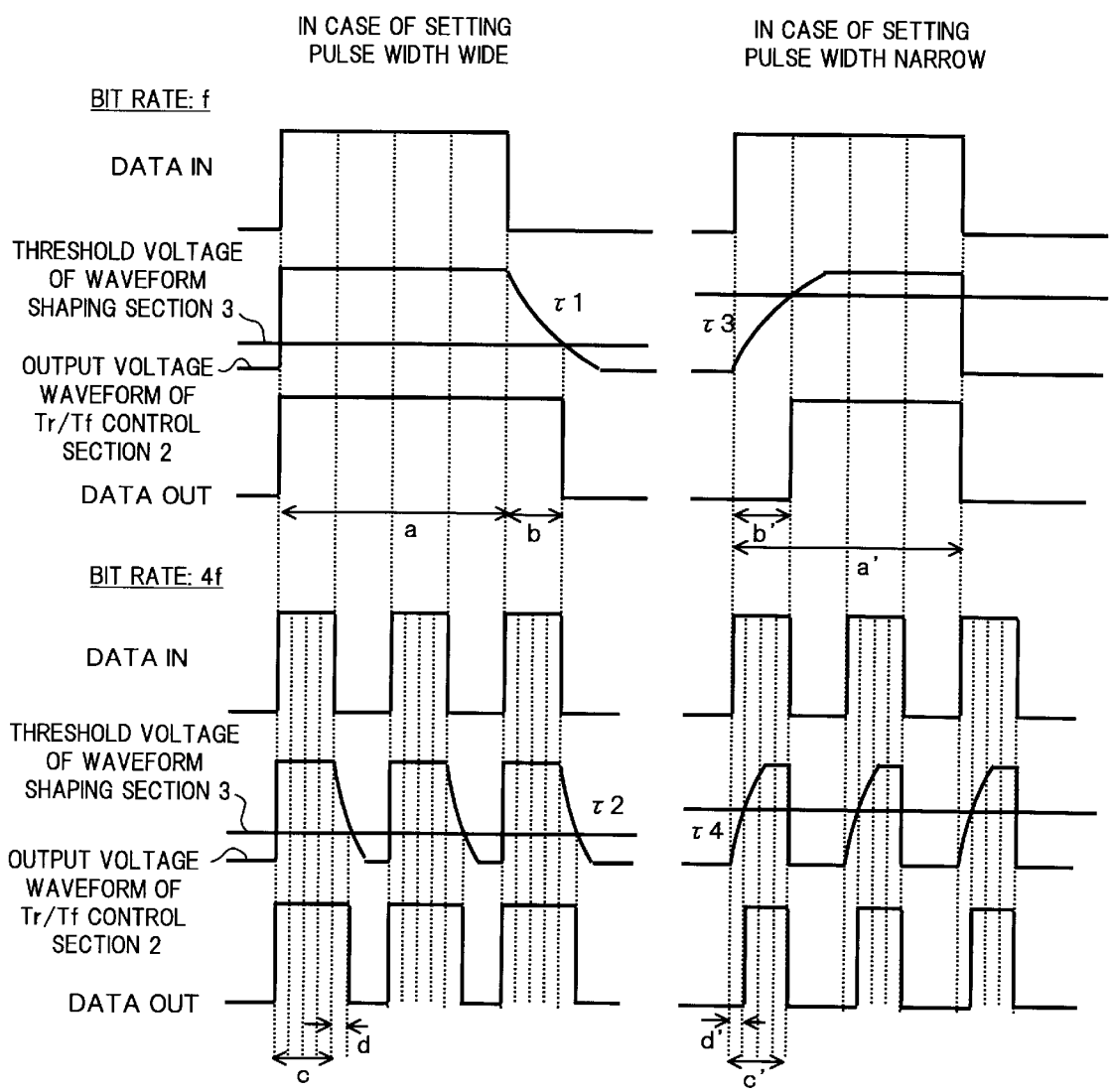
FIG. 2 is a diagram explaining an operating principle of the pulse width control circuit of the present invention.

FIG. 2 is a diagram for explaining the operating principle of the present pulse width control circuit. In this figure, a waveform example in the case where the pulse width is set to be wide is shown on the left, and a waveform example in the case where the pulse width is set to be narrow is shown on the right.

In the case where the pulse width is set to be wide based on control information supplied from exterior for widening the pulse width, in the control signal generating section 1, the Tr/Tf control signal Sc for delaying, for example, the fall time Tf of the input signal DATA_IN according to a bit rate, is generated to be sent to the Tr/Tf control section 2. Although, here, the consideration is made on the case where the fall time Tf is delayed, the rise time Tr of the input signal DATA_IN may be advanced according to the bit rate, or alternatively, the fall time Tf may be delayed while the rise time Tr being advanced according to the bit rate.

In the Tr/Tf control section 2, there is performed a control for delaying the fall time Tf of the input signal DATA_IN according to the bit rate, in accordance with the Tr/Tf control signal Sc. In other words, the current source 2A is controlled in accordance with the Tr/Tf control signal Sc, so that the fall time constant of the input signal DATA_IN in the integrating element 2C is determined according to the bit rate. Specifically, a fall time constant $\tau 1$ of when the bit rate is f is set to be four times a fall time constant $\tau 2$ of when the bit rate is 4f ($\tau 1=4\times\tau 2$). Consequently, a signal having a voltage waveform corresponding to the bit rate as shown in the second and fifth levels from the top in FIG. 2 is output from the Tr/Tf control section 2 to the waveform shaping section 3.

Then, in the waveform shaping section 3, a comparison between a voltage level of the signal from the Tr/Tf control section 2 and a threshold voltage is performed, and the output signal DATA_OUT as shown in the third and sixth levels from the top in FIG. 2 is generated. For this output signal DATA_OUT, a pulse width control amount (rate of width to be broadened relative to the pulse width of the input signal DATA_IN) in each bit rate is the same, that is, in FIG. 2 b/a=d/c.

On the other hand, as shown on the right side of FIG. 2, in the case where the pulse width is set to be narrow, in the control signal generating section 1, based on control information supplied from exterior for narrowing the pulse width, the Tr/Tf control signal Sc for delaying, for example, the rise time Tr of the input signal DATA_IN according to the bit rate, is generated to be sent to the Tr/Tf control section 2. Although, here, the consideration is made on the case where the rise time Tr is delayed, the fall time Tf of the input signal DATA_IN may be advanced according to the bit rate, or alternatively, the fall time Tf may be advanced while the rise time Tr being delayed according to the bit rate.

In the Tr/Tf control section 2, there is performed a control for delaying the rise time Tr of the input signal DATA_IN, according to the bit rate, in accordance with the Tr/Tf control signal Sc. In other words, the current source 2A is controlled in accordance with the Tr/Tf control signal Sc, so that the rise time constant of the input signal DATA_IN in the integrating element 2C is determined according to the bit rate. Specifically, a rise time constant $\tau 3$ of when the bit rate is f is set to be four times a rise time constant $\tau 4$ of when the bit rate is 4f ($\tau 3=4\times\tau 4$). Consequently, a signal having a voltage waveform corresponding to the bit rate as shown in the second and fifth levels from the top in FIG. 2 is output from the Tr/Tf control section 2 to the waveform shaping section 3.

Then, in the waveform shaping section 3, a comparison between the voltage level of the signal from the Tr/Tf control section 2 and the threshold voltage is performed, and the output signal DATA_OUT as shown in the third and sixth levels from the top in FIG. 2 is generated. For this output signal DATA_OUT, a pulse width control amount (rate of width to be narrowed relative to the pulse width of the input signal DATA_IN) in each bit rate is the same, that is, in FIG. 2 b'/a'=d'/c'.

According to this pulse width control circuit of the present invention, the rise time Tr and the fall time Tf of the input signal DATA_IN is controlled according to the bit rate. Then, even if the bit rate is changed, it is possible to primarily determine a pulse width adjustment amount, thus enabling to respond to multi-bit rates.

Next, specific embodiments of each structure of the pulse width control circuit according to the present invention described above will be described.

Figure 3:
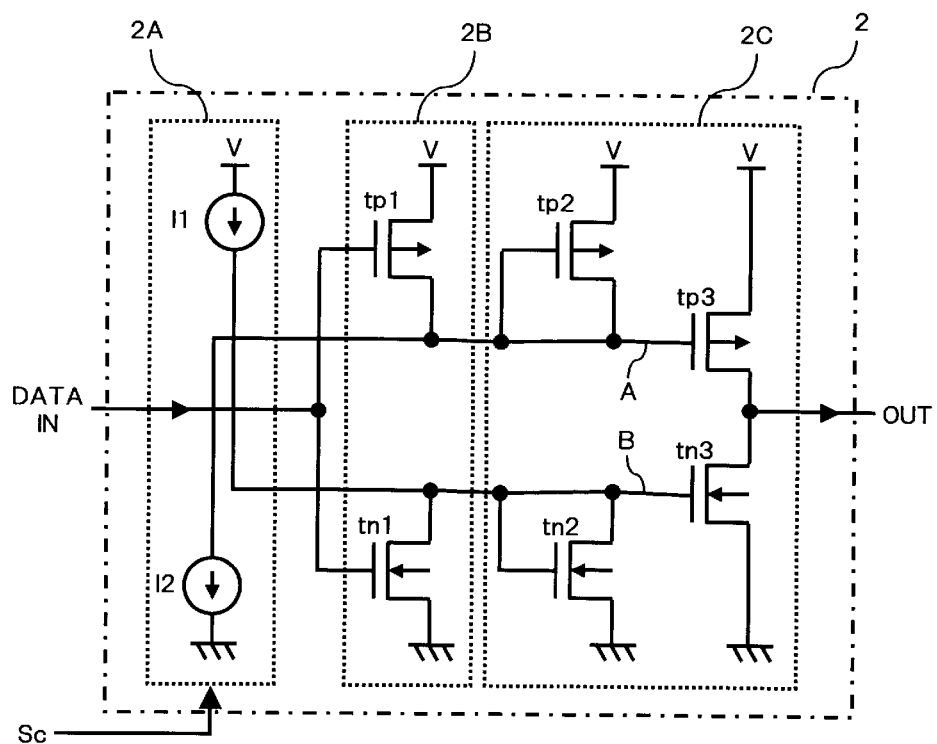
FIG. 3 is a diagram showing an example of a specific circuit structure of a Tr/Tf control section.

FIG. 3 is a diagram showing an example of a specific circuit structure of the Tr/Tf control section.

In FIG. 3, the Tr/Tf control section 2 is of a simple circuit structure provided with, for example, two current sources I1 and I2 as the current source 2A, a P-channel MOSFET tp1 and an N-channel MOSFET tn1 as the bit detection element 2B, and two P-channel MOSFETs tp2 and tp3 and two N-channel MOSFETs tn2 and tn3 as the integrating element 2C.

The current source I1 has one terminal connected to a power source V and the other terminal connected to a drain terminal of the N-channel MOSFET tn1, and a current value thereof is controlled in accordance with the Tr/Tf control signal Sc from the control signal generating section 1. The current source I2 has one terminal grounded and the other terminal connected to a drain terminal of the P-channel MOSFET tp1, and a current value thereof is controlled in accordance with the Tr/Tf control signal Sc from the control signal generating section 1. Specific current sources I1 and I2 can be made up of current mirror circuits, to which the current from the control signal generating section 1 is input, in the case where a current of a required value is output from the control signal generating circuit 1 as the Tr/Tf control signal Sc, for example,.

The P-channel MOSFET tp1 as the bit detection element 2B, has a gate terminal connected to an input terminal of the Tr/Tf control section 2, and a source terminal connected to the power source V. The N-channel MOSFET tn1 has a gate terminal connected to the input terminal of the Tr/Tf control section 2 and a source terminal grounded.

The P-channel MOSFET tp2 has a drain terminal and a gate terminal each connected to the current source I2, and a source terminal connected to the power source V. The N-channel MOSFET tn2 has a drain terminal and a gate terminal each connected to the current source I1 and a source terminal grounded. The P-channel MOSFET tp3 has a source terminal connected to the power source V, a gate terminal connected to the current source I2, and a drain terminal connected to an output terminal of the Tr/Tf control section 2. The N-channel MOSFET tn3 has a source terminal grounded, a gate terminal connected to the current source I1, and a drain terminal connected to the output terminal of the Tr/Tf control section 2.

In the Tr/Tf control section 2 of such a circuit structure as described above, the current source I2 is adjusted in order to control the rise time Tr of the input signal DATA_IN, while the current source I1 being adjusted in order to control the fall time Tf.

Figure 4:
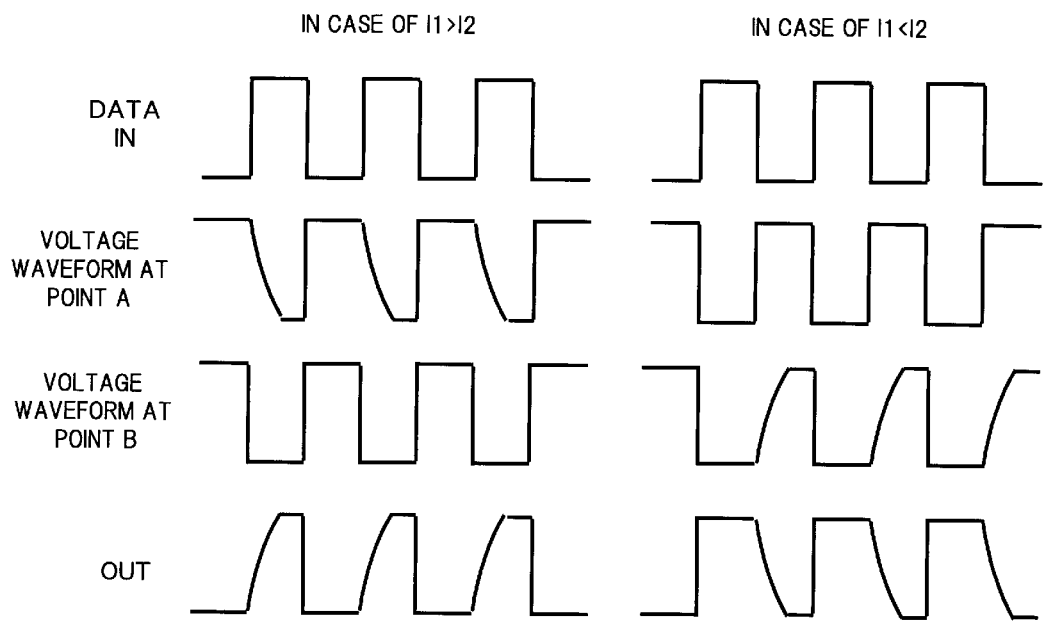
FIG. 4 is a diagram explaining an operation of the Tr/Tf control section of FIG. 3.

Specifically, as shown on the left side of FIG. 4, for example, in the case where the current value of the current source I1 is set to be sufficiently large and the current value of the current source I2 is set to be less than the current value of the current source I1 (I1>I2), the band of the P-channel MOSFET tp2 in the integrating element 2C is lowered. Therefore, when it is detected by the bit detection element 2B that the input signal DATA_IN is changed from "LOW" to "HI", the speed of a drain point (point A) of the P-channel MOSFET tp2 to be changed to "LOW" is slowed down. Thereby, since the speed of the P-channel MOSFET tp3 to turn on is slowed down, the speed of the output signal OUT of the Tr/Tf control section 2 to be changed to "HI" is slowed down. As a result, a signal OUT whose rise time Tr is later than that of the input signal DATA_IN is output. Consequently, the rise time constant of the input signal DATA_IN is set to a desired value by adjusting the current value of the current source I2.

On the other hand, as shown on the right side of FIG. 4, for example, in the case where the current value of the current source I2 is set to be sufficiently large and the current value of the current source I1 is set to be less than the current value of the current source I2 (I1<I2), the band of the N-channel MOSFET tn2 in the integrating element 2C is lowered. Therefore, when it is detected by the bit detection element 2B that the input signal DATA_IN is changed from "HI" to "LOW", the speed of a drain point (point B) of the N-channel MOSFET tn2 to be changed to "HI" is slowed down. Thereby, since the speed of the N-channel MOSFET tn3 to turn on is slowed down, the speed of the output signal OUT of the Tr/Tf control section 2 to be changed to "LOW" is slowed down. As a result, a signal OUT whose fall time Tf is later than that of the input signal DATA_IN is output. Consequently, the fall time constant of the input signal DATA_IN is set to a desired value by adjusting the current value of the current source I1.

An example in which noise resistance of the Tr/Tf control section 2 shown in FIG. 3 is improved will be described.

Figure 5:
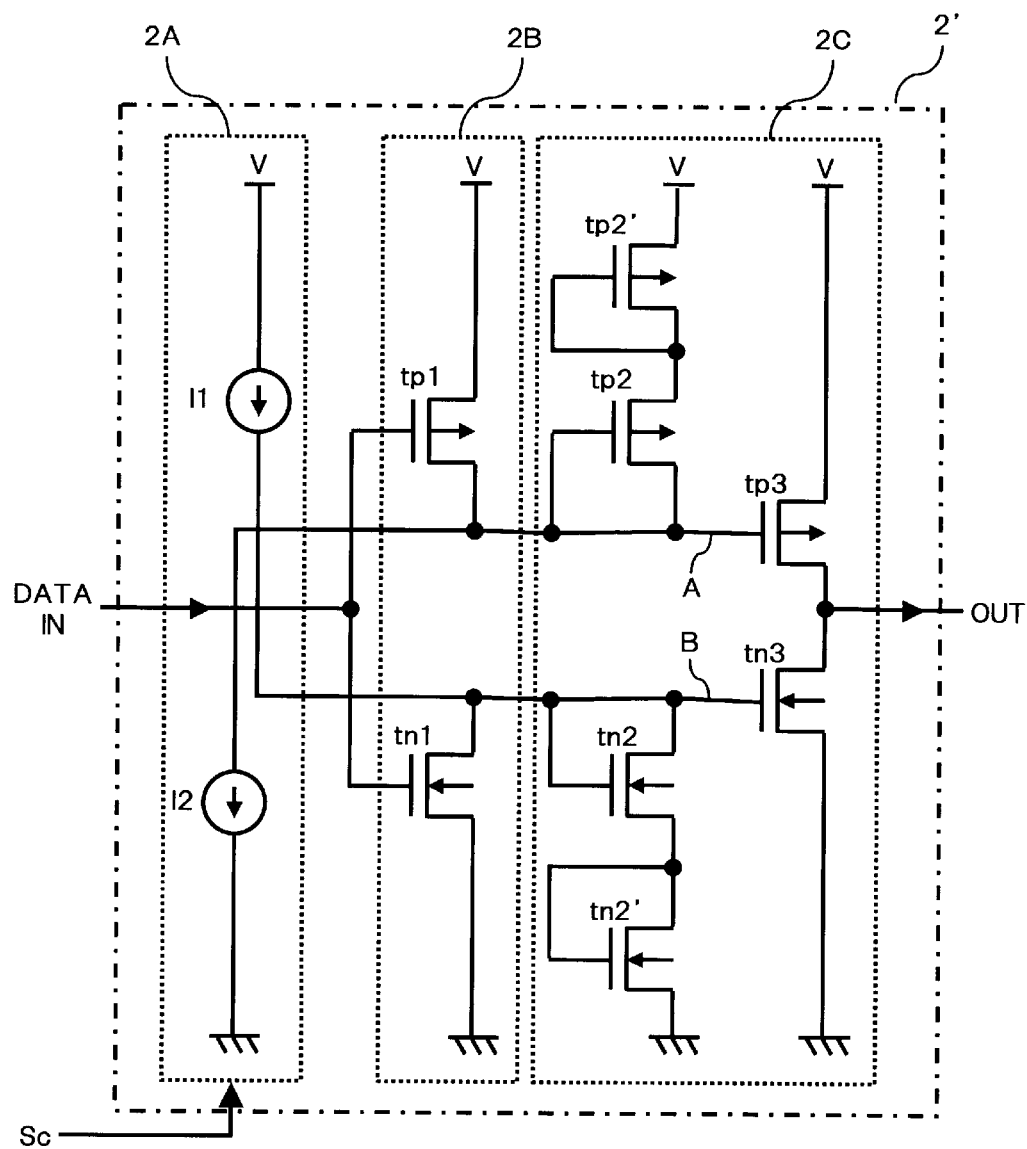
FIG. 5 is a diagram showing an example of a specific circuit structure of the Tr/Tf control section to improve noise resistance.

FIG. 5 is a diagram showing an example of the specific circuit structure of the Tr/Tf control section to improve noise resistance.

A difference between a structure of a Tr/Tf control section 2' of FIG. 5 and the Tr/Tf control section 2 of FIG. 3 is in that a P-channel MOSFET tp2' and an N-channel MOSFET tn2' are added to the integrating element 2C.

The P-channel MOSFET tp2' has a drain terminal and a gate terminal each connected to the source terminal of the P-channel MOSFET tp2, and a source terminal connected to the power source V. The N-channel MOSFET tn2' has a drain terminal and a gate terminal each connected to the source terminal of the N-channel MOSFET tn2, and a source terminal grounded.

Figure 6:
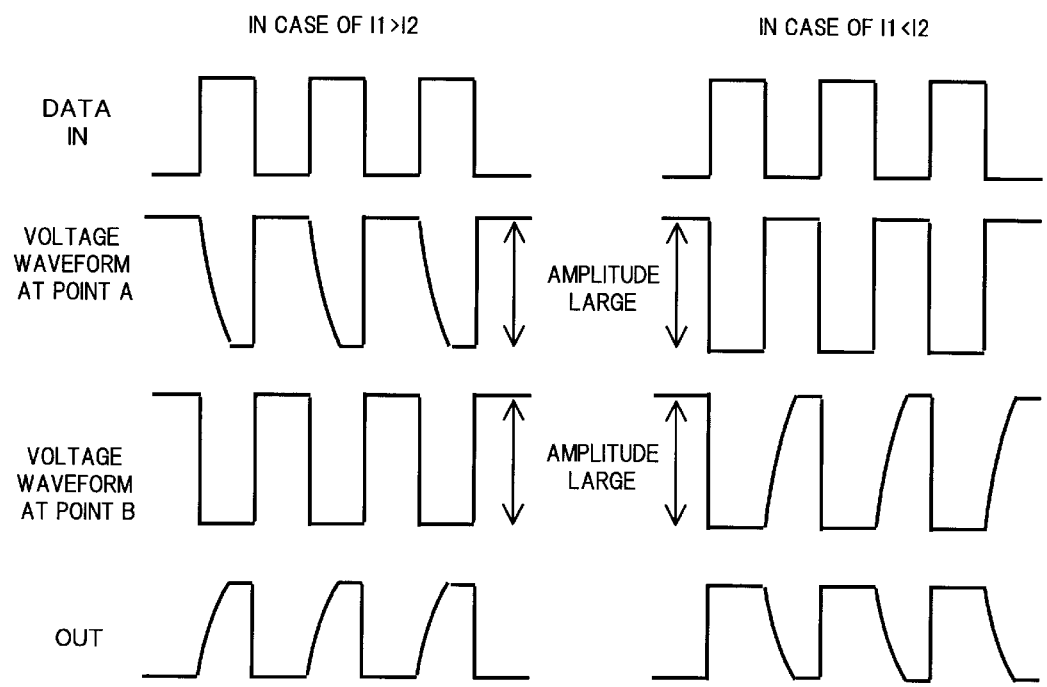
FIG. 6 is a diagram explaining an operation of the Tr/Tf control section of FIG. 5.

A basic operation of the above Tr/Tf control section 2' is the same as that of the Tr/Tf control section 2 of FIG. 3 described above. However, since the P-channel MOSFET tp2' and the N-channel MOSFET tn2' are connected so that amplitudes of voltage signals in points A and B shown in the second and third levels from the top in FIG. 6 become large, resistance of the Tr/Tf control section 2' to power source noise and ground noise is improved.

Next, there will be described a modification example of the Tr/Tf control section 2 shown in FIG. 3, in which two current sources I1 and I2 are simultaneously controlled based on the Tr/Tf control signal Sc.

Figure 7:
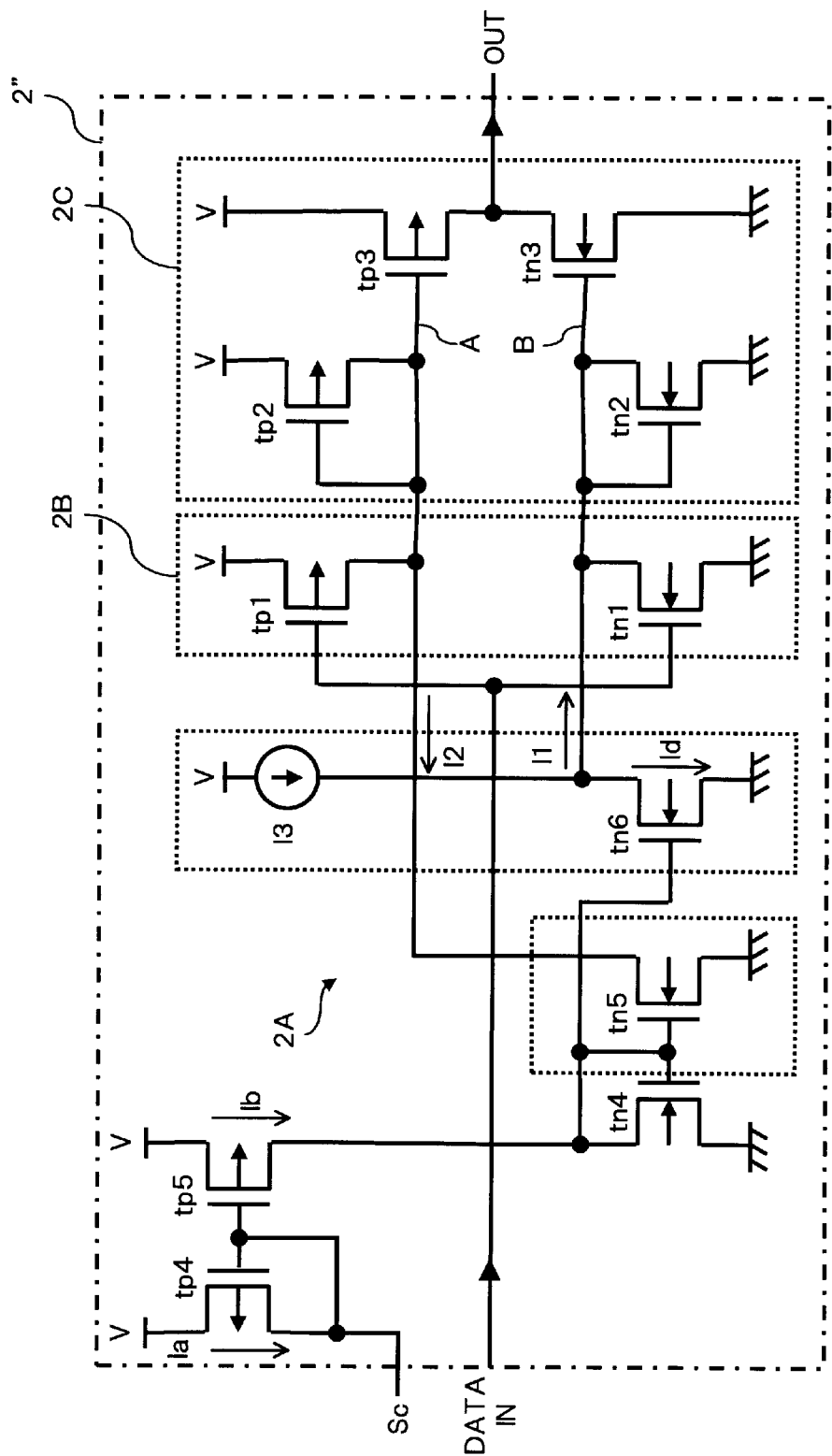
FIG. 7 is a diagram showing a specific circuit structure of a modification example of the Tr/Tf control section of FIG. 3.

FIG. 7 is a diagram showing a specific circuit structure of the modification example of the Tr/Tf control section of FIG. 3.

In FIG. 7, in a Tr/Tf control section 2", instead of the current sources I1 and I2 in the Tr/Tf control section 2 of FIG. 3, there are provided two P-channel MOSFETs tp4 and tp5 constituting a first current mirror circuit to which the Tr/Tf control signal Sc is input from the control signal generating section 1, two N-channel MOSFETs tn4 and tn5 constituting a second current mirror circuit to which an output signal of the first current mirror circuit is input, and a current source I3 and a N-channel MOSFET tn6 connected to the current source I3. Constitutions other than those described above, that is, the constitutions of the bit detection element 2B and the integrating element 2C are the same as those of the Tr/Tf control section 2 of FIG. 3. Further, these constitutions may be the same as those of the Tr/Tf control section 2' of FIG. 5.

The P-channel MOSFET tp4 constituting the first current mirror circuit has a source terminal connected to the power source V, and a commonly connected drain terminal and a gate terminal, to which the Tr/Tf control signal Sc is input from the control signal generating section 1. Further, the P-channel MOSFET tp5 has a source terminal connected to the power source V, a gate terminal connected to the gate terminal of the P-channel MOSFET tp4, and a drain terminal connected to the second current mirror circuit.

The N-channel MOSFET tn4 constituting the second current mirror circuit has a source terminal grounded, and a commonly connected drain terminal and a gate terminal, to which a current from the first current mirror circuit is input. Further, the N-channel MOSFET tn5 has a source terminal grounded, a gate terminal connected to the gate terminal of the N-channel MOSFET tn4, and a drain terminal connected to the drain terminal of the P-channel MOSFET tp1 of the bit detection element 2B.

The current source I3 has one terminal connected to the power source V, and the other terminal connected to the drain terminals of the N-channel MOSFETs tn1 and tn6. The N-channel MOSFET tn6 has a gate terminal connected to an output of the first current mirror circuit, that is, the drain terminal of the P-channel MOSFET tp5, and a source terminal grounded.

In the Tr/Tf control section 2" having such a constitution, the current source I3 and the N-channel MOSFET tn6 correspond to the current source I1 of the Tr/Tf control section 2 of FIG. 3, and the N-channel MOSFET tn5 (output current from the second current mirror circuit) corresponds to the current source I2 of the Tr/Tf control section 2 of FIG. 3.

Figure 8:
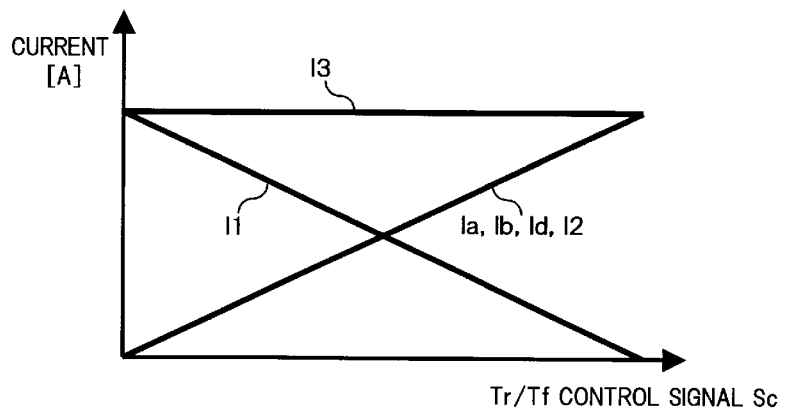
FIG. 8 is a graph showing relations of current values in each part of the Tr/Tf control section of FIG. 7.

In the Tr/Tf control section 2", a current of a desired value is input to the first current mirror circuit, as the Tr/Tf control signal Sc from the control signal generating section 1, so that a current flows to each part in accordance with a relationship shown in FIG. 8. The abscissa of FIG. 8 represents a level of the Tr/Tf control signal Sc, that is, a value of the current input to the first current mirror circuit, and the ordinate represents a current Ia flowing through the P-channel MOSFET tp4, a current Ib flowing through the P-channel MOSFET tp5, a current Id flowing through the N-channel MOS- FET tn6, a current I1 flowing through the drain point of the N-channel MOSFET tn1, and a current I2 flowing through the drain point of the P-channel MOSFET tp1. As shown in FIG. 8, in the Tr/Tf control section 2″, the respective currents I1 and I2 can be simultaneously controlled by one type of Tr/Tf control signal Sc. Note, in order to specifically control the pulse width, similarly to the case described above, the Tr/Tf control signal Sc may be appropriately set so that the values of the currents I1 and I2 become desired values according to the bit rate.

Next, another specific structural example of the Tr/Tf control section will be described.

Figure 9:
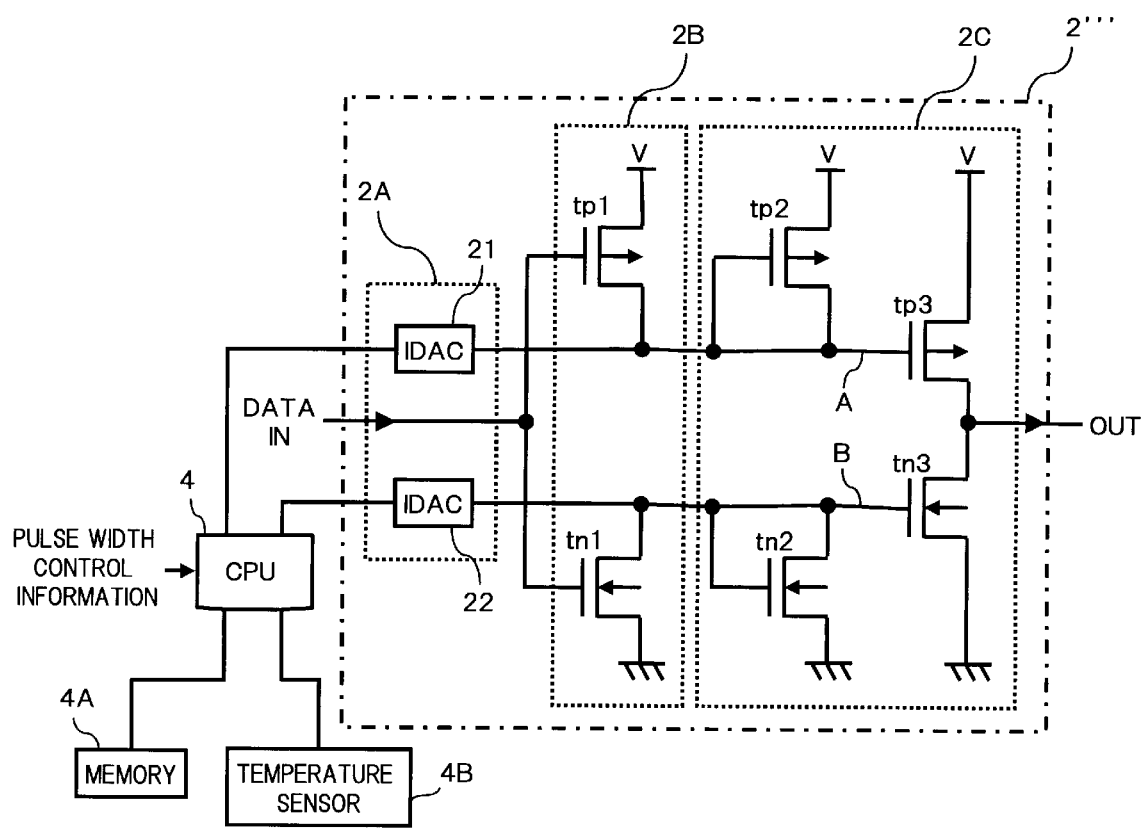
FIG. 9 shows another specific circuit structure example of the Tr/Tf control section.

FIG. 9 shows another specific structural example of the Tr/Tf control section.

In the Tr/Tf control section 2‴ of FIG. 9, the current source 2A comprises current output D/A converters (IDACs) 21 and 22 controlled by signals from a CPU 4. For example, a memory 4A comprising a ROM, a non-volatile memory or the like, and a temperature sensor 4B detecting the surrounding temperature, are connected to the CPU 4. Signals for controlling the current output D/A converters 21 and 22 are generated by the CPU 4, based on pulse width control information supplied from exterior, information stored in the memory 4A, and the detection result of the temperature sensor 4B. Consequently, when the present Tr/Tf control section 2‴ is used, a function corresponding to the control signal generating section 1 is realized by the CPU 4, the memory 4A, and the temperature sensor 4B. The constitutions of the bit detection element 2B and the integrating element 2C are the same as those of the Tr/Tf control section 2 of FIG. 3.

In the Tr/Tf control section 2‴ having the constitution described above, the stored information of the memory 4A is read out by the CPU 4 according to the pulse width control information from exterior and the detection result of the temperature sensor 4B, and the signal for controlling each of the current output D/A converters 21 and 22 is generated. Specifically, a corresponding relationship between an LD turn-on delay time and the pulse width control information is previously stored in the memory 4A, and also, as LD temperature characteristic information, information relating to temperature characteristic with regard to a threshold current Ith, a modulated current Ip and a bias current Ib of the LD are previously stored in the memory 4A. Thus, the LD turn-on delay time is calculated in accordance with the equation (1) described above, using the LD temperature characteristic information corresponding to the detection result of the temperature sensor 4B, and based on the corresponding relationship between the turn-on delay time and the pulse width control information, the current values of the current output D/A converters 21 and 22 are controlled so as to realize the rise time Tr and the fall time Tf corresponding to the bit rate. Then, the currents generated by the current output D/A converters 21 and 22 flow through the drain points of the P-channel MOSFET tp1 and the N-channel MOSFET tn1, thereby, similarly to the case of the Tr/Tf control section 2 of FIG. 3 described above, the rise time Tr and fall time Tf of the input signal DATA_IN are controlled. Thus, it becomes possible to realize an automatic control of the pulse width according to the LD temperature characteristic.

The circuit example shown in FIG. 9 described above has been constituted to use the current output D/A converters. Other than this, the constitution may be such that voltage output D/A converters controlled by the CPU 4, for example, are used, and a circuit for converting an output voltage of each of the voltage output D/A converters to a current is provided. Further, although the constitution has been such that the pulse width control information from exterior is sent to the CPU 4, it is also possible to previously store the pulse width control information in the memory 4A.

Next, a circuit structure suitable for the waveform shaping section 3 of the pulse width control circuit of the present invention will be described.

Figure 10:
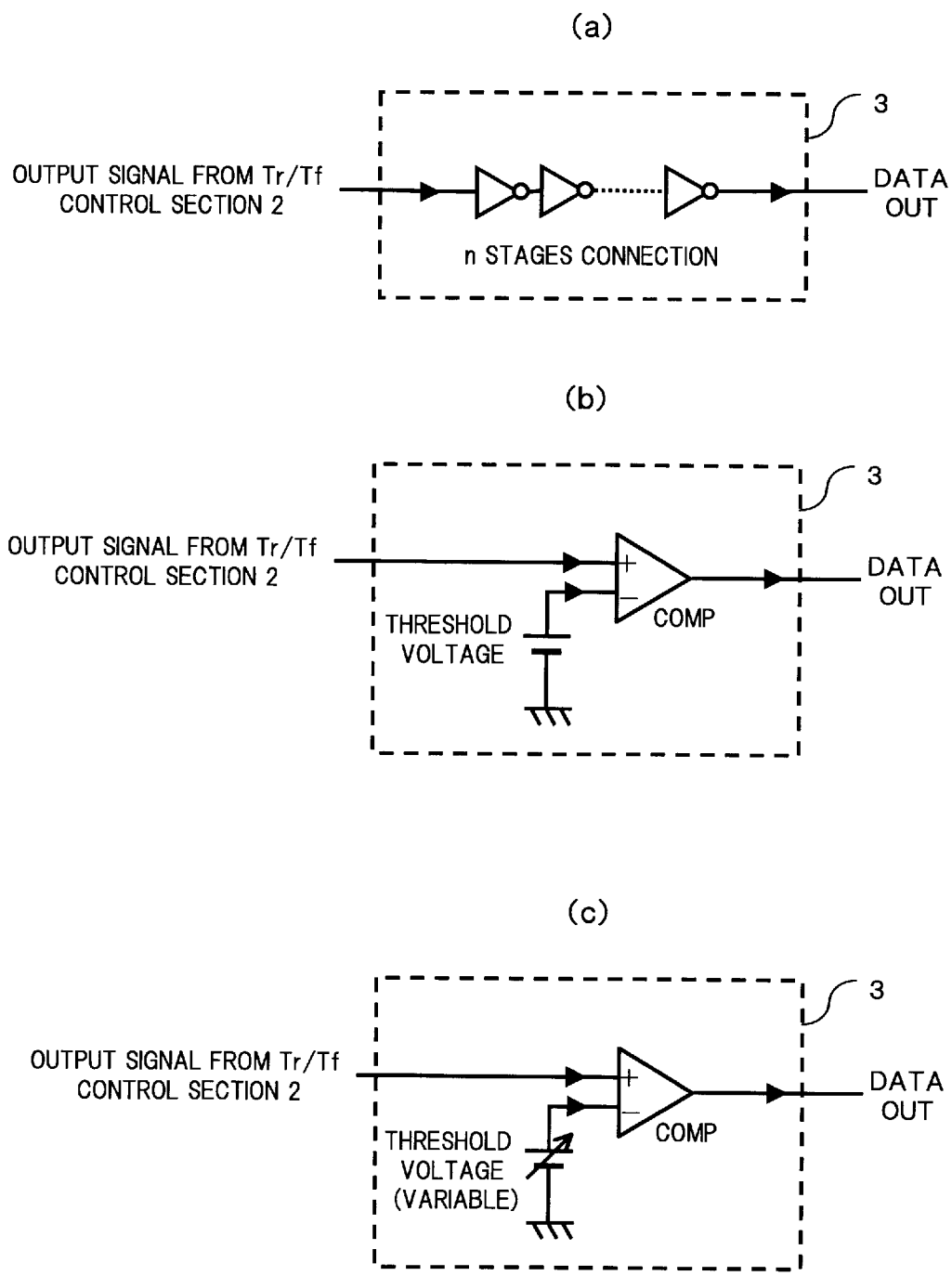
FIG. 10 is a diagram enumerating specific circuit structure examples of a waveform shaping section.

FIG. 10 is a diagram that enumerates specific circuit structure examples of the waveform shaping section 3. The circuit structure of (a) in FIG. 10 is one example in which the waveform shaping section 3 is formed by inverters of n-stages to which a signal from the Tr/Tf control section 2 is input. In the case where inverters of even-numbered stages are used in this waveform shaping section 3, when the rise time Tr of the input signal of the waveform shaping section 3 is delayed, while the fall time Tf being advanced, for example, timing when an N-channel MOSFET constituting a first stage inverter is turned on is delayed, thus the rise of the output signal of the waveform shaping section 3 is delayed by a time of a delay in the rise time Tr added with a circuit delay time, compared to the rise of the input signal DATA_IN of the pulse width control circuit. However, since the fall of the output signal of the waveform shaping section 3 is delayed by the circuit delay time only, compared to the fall of the input signal DATA_IN of the pulse width control circuit, as a result, the output signal DATA_OUT of the waveform shaping section 3 has a pulse width narrower than that of the input signal DATA_IN of the pulse width control circuit. On the contrary, if the rise time Tr of the input signal of the waveform shaping section 3 is advanced, while the fall time Tf being delayed, the output signal DATA_OUT of the waveform shaping section 3 has a pulse width wider than that of the input signal DATA_IN of the pulse width control circuit.

Further, the circuit structure of (b) in FIG. 10 is an example in which the waveform shaping section 3 is formed by a comparator (COMP) to which a signal from the Tr/Tf control section 2 is input as a forward input (or inversion input), and the threshold voltage generated at the constant voltage source is input as the inversion input (or the forward input). In this waveform shaping section 3, it is also possible to achieve the same operational effects as in the constitution using the inverters of n-stages described above. Further, the circuit structure of (c) of FIG. 10 is a circuit that enables the threshold voltage input to the comparator to be adjusted from exterior, thereby capable to further widen a pulse width control range.

Next, a circuit structure suitable for the control signal generating section 1 of the pulse width control circuit according to the present invention will be described.

Figure 11:
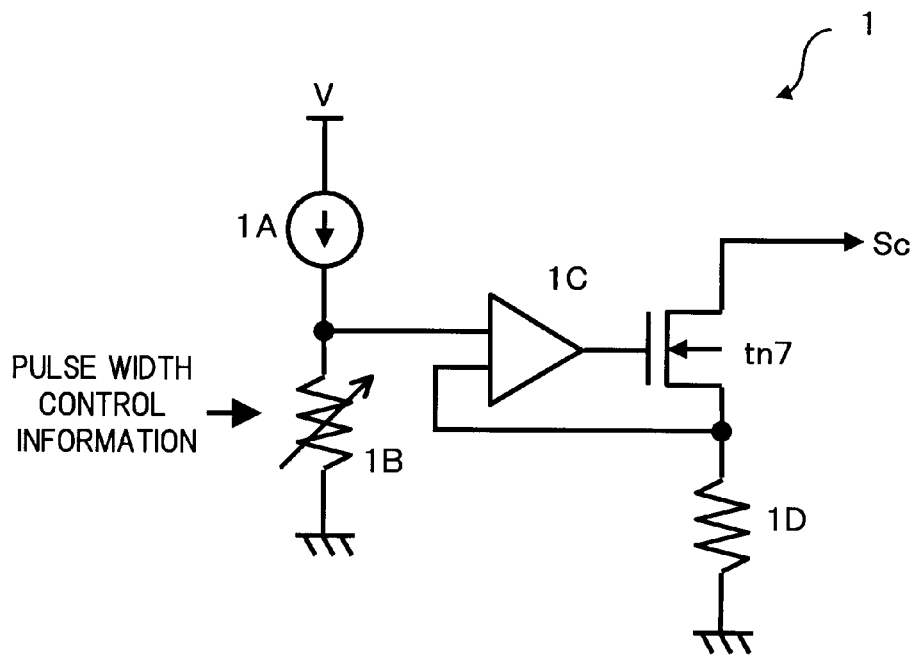
FIG. 11 is a diagram enumerating specific circuit structure examples of a control signal generating section.
Figure 11:
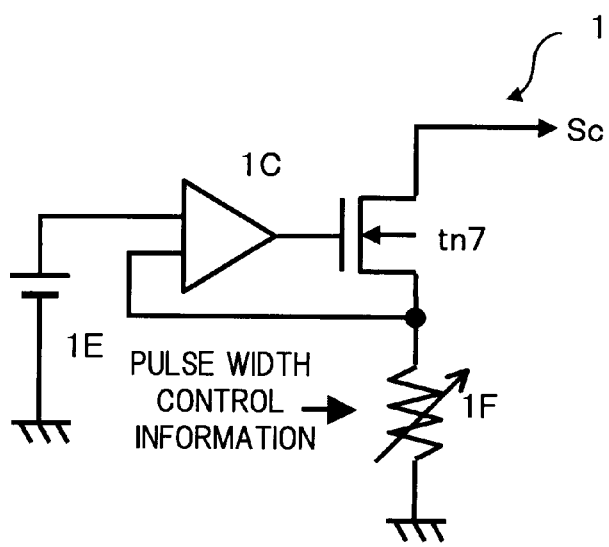

FIG. 11 is a diagram that enumerates specific circuit structure examples of the control signal generating section 1. The circuit structure of (a) in FIG. 11 is an example in which the control signal generating section 1 is formed using: a constant current source 1A and a variable resistor 1B connected in series between the power source and ground; an operational amplifier 1C with one input terminal connected to a common connection point of the constant current source 1A and the variable resistor 1B; an N-channel MOSFET tn7 having a gate terminal connected to an output terminal of the operational amplifier 1C, a source terminal connected the other input terminal of the operational amplifier 1C, and a drain terminal connected to an output terminal of the control signal generating section 1; and a resistor 1D having one terminal connected to the source terminal of the N-channel MOSFET tn7 and the other terminal grounded. In this control signal generating section 1, a current output as the Tr/Tf control signal Sc can be controlled to a desired value by adjusting a resistance value of the variable resistor 1B according to the pulse width control information.

Further, the circuit structure of (b) of FIG. 11 is an example in which the control signal generating section 1 is formed, by providing a constant voltage source 1E instead of the above constant current source 1A and variable resistor 1B, and a variable resistor 1F instead of the resistor 1D. In this control signal generating section 1, a current output as the Tr/Tf control signal Sc can be controlled to a desired value by adjusting a resistance value of the variable resistor 1F according to the pulse width control information.

As a specific circuit example of the control signal generating section 1, such a constitution as shown in FIG. 9 comprising the CPU 4, memory 4A and temperature sensor 4B may be used. In this case, as described above, a current output D/A converter or the like is used as the current source 2A of the Tr/Tf control section 2.

Further, for the control signal generating section 1 of each circuit structure shown in FIG. 11, it is also possible to modify to add the temperature information. Specifically, a thermistor or the like is provided instead of the resistor 1D in the circuit structure of (a) in FIG. 11, and a constant current source and a thermistor or the like connected in series between the power source and ground are provided instead of the constant voltage source 1E in the circuit structure of (b) of FIG. 11, so that the Tr/Tf control signal Sc is generated according to a change in the ambient temperature. Further, it is possible to obtain the temperature information, based on a Vf characteristic, using a diode instead of the above thermistor. If a diode is used, it is possible to monitor the temperature of the interior of an IC, even if the circuit of the control signal generating section 1 is integrated.

Figure 12:
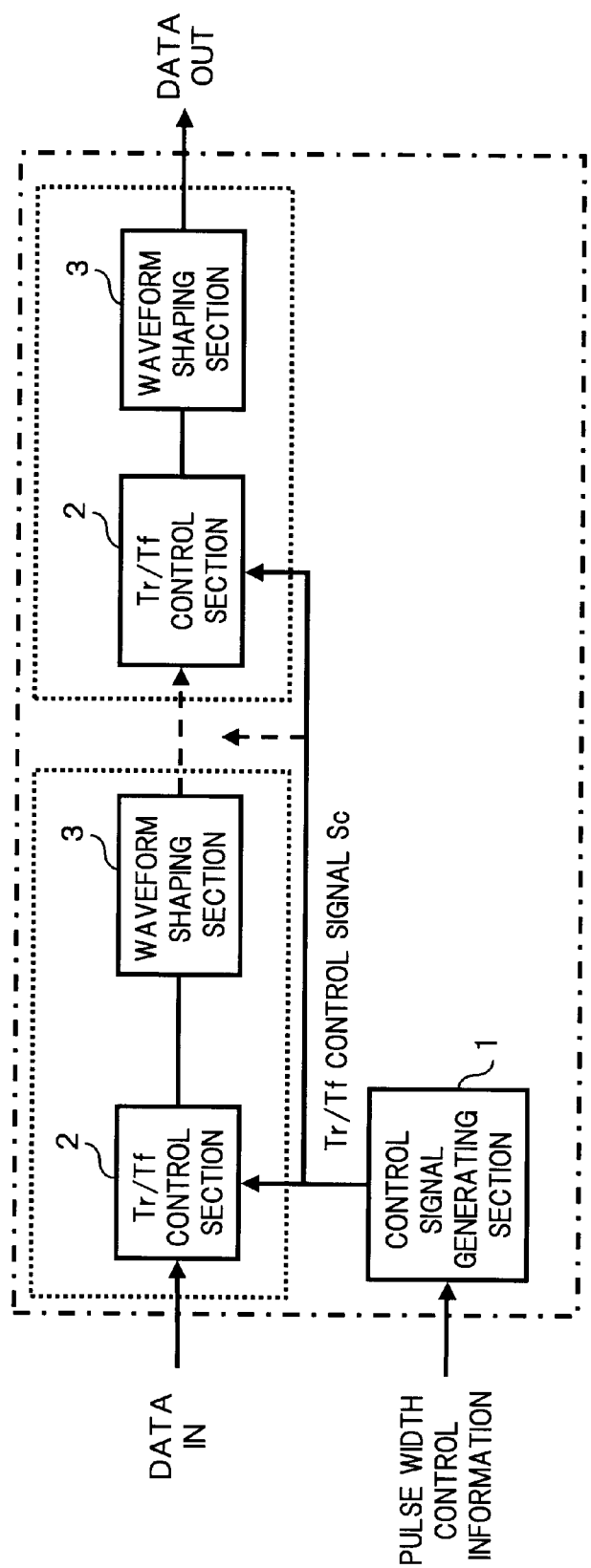
FIG. 12 is a diagram showing, as an application of the basic structure of FIG. 1, a structural example in the case where the Tr/Tf control sections and waveform shaping sections are connected in multi-stages.
Figure 13:
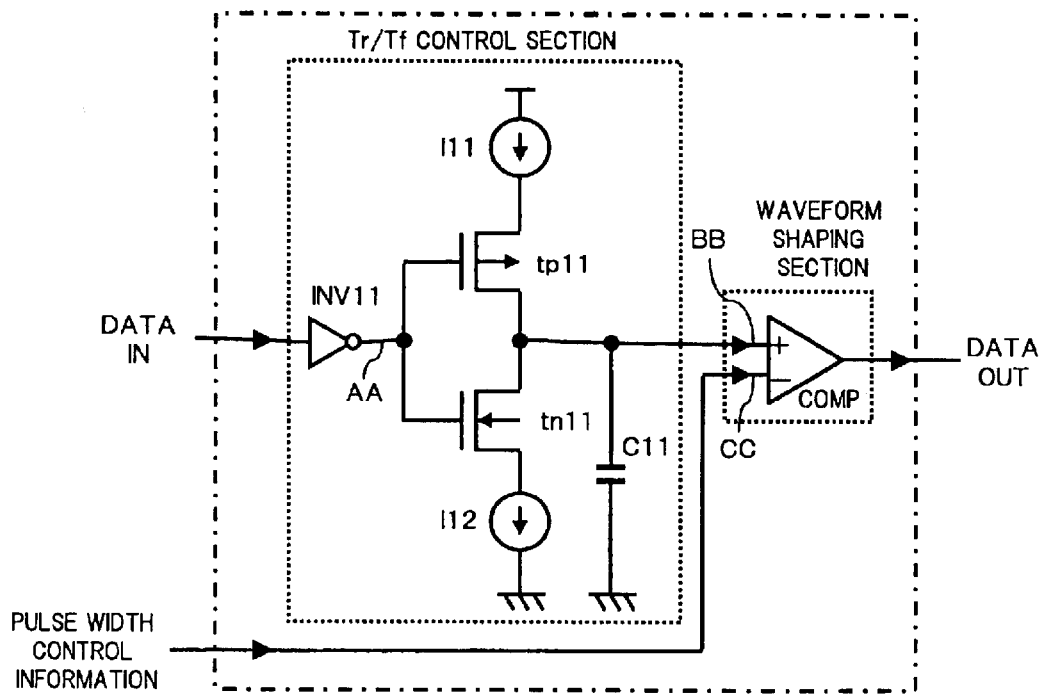
FIG. 13 is a circuit diagram showing a structural example of a conventional pulse width control circuit.
Figure 14:
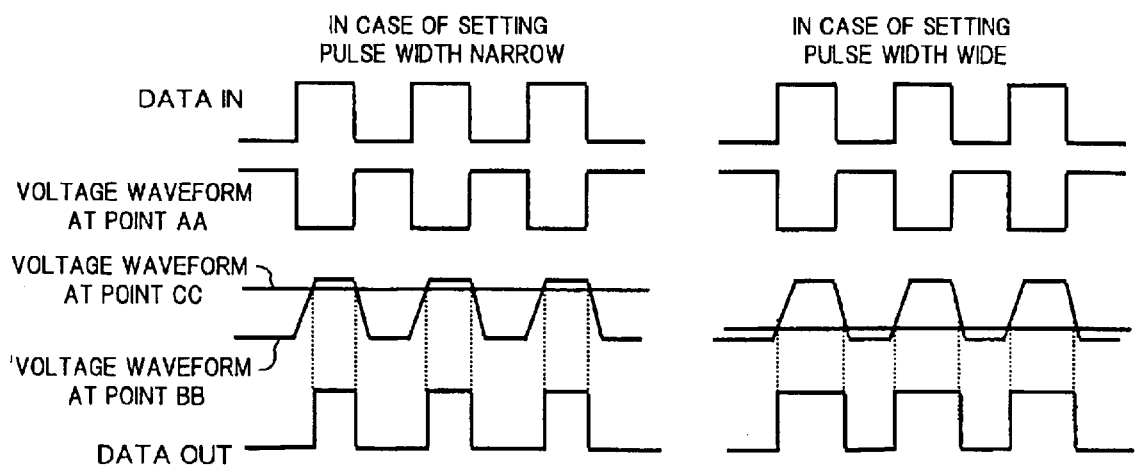
FIG. 14 is a diagram explaining an operation of the conventional pulse width control circuit.
Figure 15:
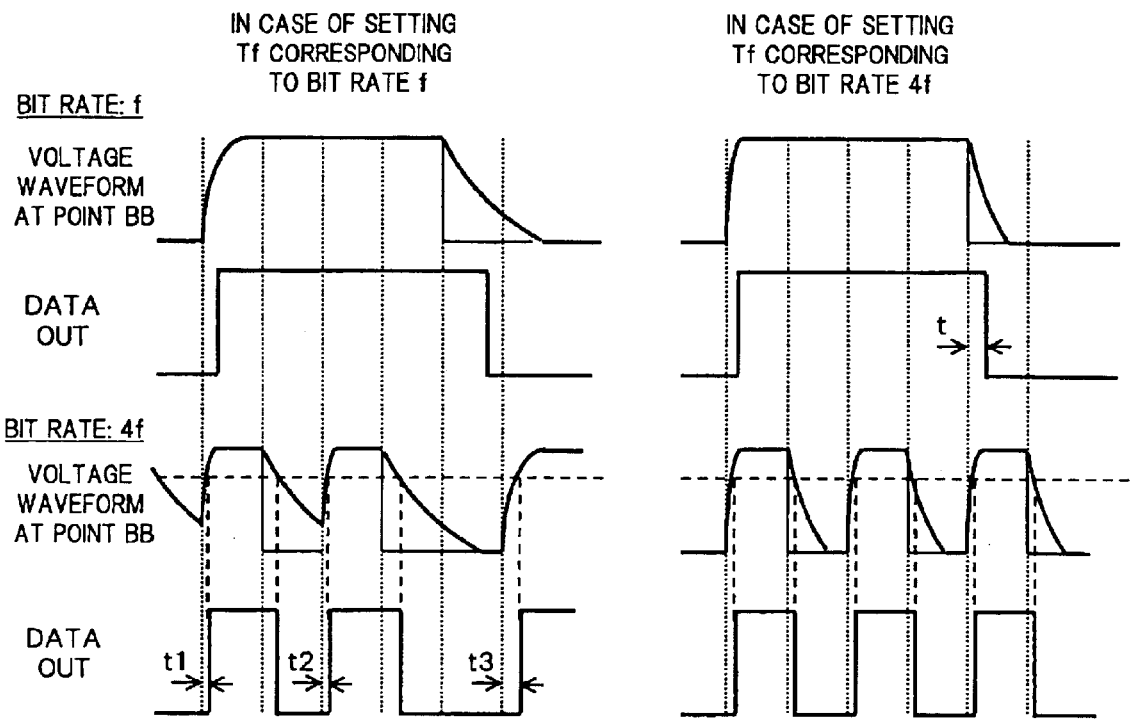
FIG. 15 is a diagram explaining that the conventional pulse width control circuit is hard to respond to multi-bit rates.
Figure 16:
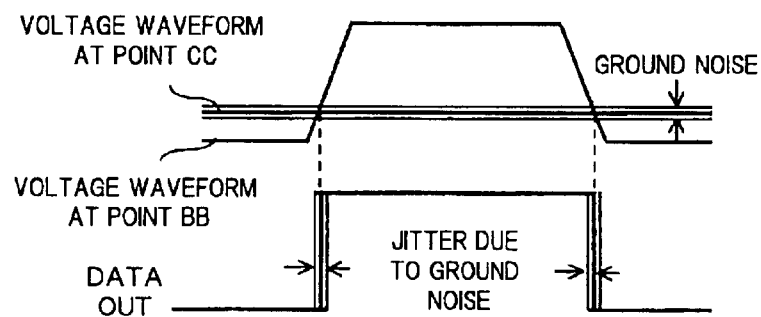
FIG. 16 is a diagram explaining that the conventional pulse width control circuit is liable to be affected by ground noise.
Figure 17:
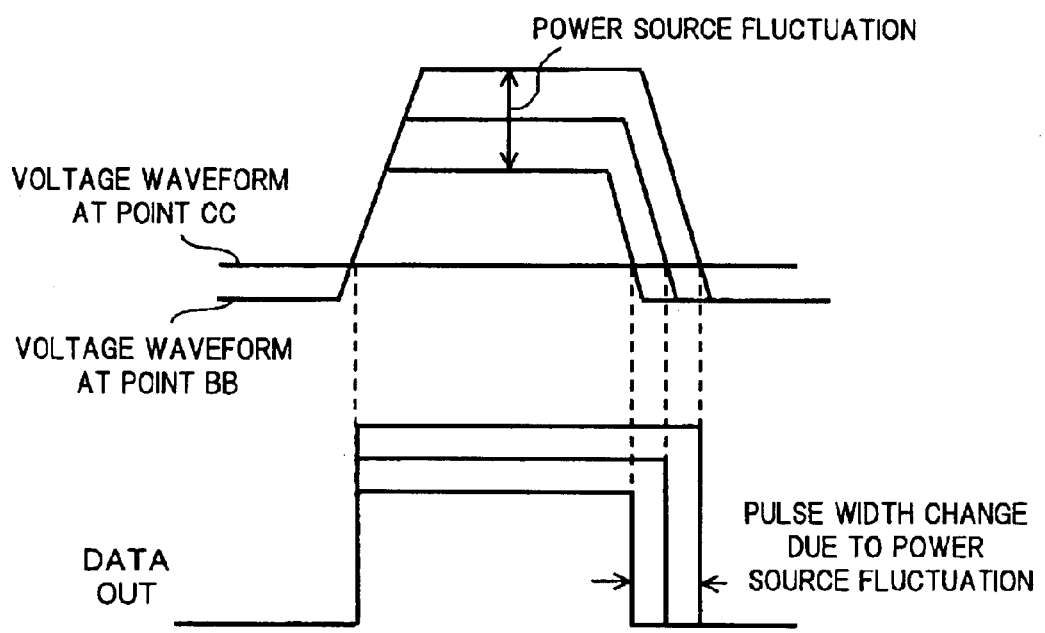
FIG. 17 is a diagram explaining that the conventional pulse width control circuit is liable to be affected by power source voltage fluctuation.

Moreover, as an application relating to the basic structure of the pulse width control circuit shown in FIG. 1 described above, for example as shown in FIG. 12, the constitution may be such that the Tr/Tf control sections 2 and waveform shaping sections 3 are connected in multi-stages, to adjust the pulse width of the input signal DATA_IN in stepwise. In this case, in particular when the pulse width is set to be wide, since the band restriction in the Tr/Tf control section 2 of each stage can be suppressed to a small range, the noise resistance at each stage can be improved, and consequently, it is possible to improve the noise resistance of the overall pulse width control circuit. Also, by suppressing an adjustment range of the pulse width at each stage to be small, it is also possible to suppress a pattern effect at each stage. Thus, since the Tr/Tf control sections 2 and the waveform shaping sections 3 are connected in multi-stages, it becomes possible to achieve effects, such as extension of the applied bit rate range, extension of the pulse width control range, suppression of pattern effect, improvement of electrical and ground noise resistances, and the like.

According to the pulse width control circuit of the present invention as described above, since one or both of the rise time Tr and fall time Tf of the input signal DATA_IN is variable controlled according to the bit rate, it is possible to easily realize the response to multi-bit rates. Further, since the Tr/Tf control sections 2 and the waveform shaping sections 3 are connected in multi-stages, it is possible to make the bit rate range wider. Specifically, it is possible to perform the pulse width control in a bit rate range of on the order of 50 Mbps to 2.4 Gbps. Furthermore, since the present pulse width control circuit is not a type of controlling the pulse width by changing the threshold voltage (slice level) in the waveform shaping section 3 as in the conventional technique, but is basically a type of variably controlling the rise time Tr and fall time Tf of the input signal DATA_IN, it is possible to improve the resistance to electrical noise and ground noise. Moreover, in this pulse width control circuit, since a DC voltage at point A in FIG. 1 is changed according to the power source voltage, and the on/off speed of the P-channel MOSFET tp3 is changed according to the power source voltage, the output signal DATA_OUT is not liable to be affected by power source voltage fluctuation. Consequently, compared to the conventional circuits, pulse width fluctuation due to power source voltage fluctuation can be suppressed. In addition, the pulse width control circuit of the present invention can be constituted by a number of MOSFETs. Therefore, the pulse width control circuit of the present invention does not affect on the chip size of LSIs, and is effective in the reduction of the chip surface area and the reduction of cost.

Industrial Applicability

The present invention, in fields such as optical communications and the like, has considerable industrial applicability as an electrical circuit technology for controlling the pulse width of data signals to be used in the drive circuits of light emitting elements.

What is claimed is:

1. A pulse width control circuit for controlling pulse width of an input signal based on pulse width control information, and generating an output signal for driving a light emitting element, comprising:
   a rise/fall control section controlling at least one of a rise time and a fall time of said input signal according to a bit rate of said input signal;
   a waveform shaping section shaping a signal output from said rise/fall control section, to generate said output signal; and
   a control signal generating section generating a control signal controlling an operation of said rise/fall control section based on said pulse width control information
   wherein said rise/fall control section comprises:
      current source controlled in accordance with the control signal from said control signal generating section;
      a bit detection element detecting a level of each bit indicated by said input signal; and
      an integrating element determining rise and fall time constants of said input signal based on a current supplied from said current source and detection results from said bit detection element,
   wherein said current source includes:
      a first current source having one terminal applied with a power source voltage, a current value thereof being controlled in accordance with the control signal from said control signal generating section; and
      a second current source having one terminal grounded, a current value thereof being controlled in accordance with the control signal from said control signal generating section;
   wherein said bit detection element includes:
      a P-channel MOSFET having a gate terminal applied with said input signal, a source terminal applied with the power source voltage, and a drain terminal connected to the other terminal of said second current source; and
      an N-channel MOSFET having a gate terminal applied with said input signal, a source terminal grounded, and a drain terminal connected to the other terminal of said first current source; and wherein said integrating circuit includes:
  a first P-channel MOSFET having a drain terminal and a gate terminal each connected to the other terminal of said second current source, and a source terminal applied with the power source voltage;
  a first N-channel MOSFET having a drain terminal and a gate terminal each connected to the other terminal of said first current source, and a source terminal grounded;
  a second P-channel MOSFET having a gate terminal connected to the other terminal of said second current source, a source terminal applied with the power source voltage, and a drain terminal connected to an output terminal of said rise/fall control section; and
  a second N-channel MOSFET having a gate terminal connected to the other terminal of said first current source, a source terminal grounded, and a drain terminal connected to the output terminal of said rise/fall control section.

2. A pulse width control circuit according to claim 1, wherein said integrating element includes:
  a third P-channel MOSFET having a drain terminal and a gate terminal each connected to the source terminal of said first P-channel MOSFET, and a source terminal applied with the power source voltage; and
  a third N-channel MOSFET having a drain terminal and a gate terminal each connected to the source terminal of said first N-channel MOSFET, and a source terminal grounded.

3. A pulse width control circuit according to claim 1, wherein said waveform shaping section is constituted by an inverter circuit that is input with a signal output from said rise/fall control section.

4. A pulse width control circuit according to claim 1, wherein said control signal generating section includes a variable resistor with a resistance value thereof being controlled based on said pulse width control information, and a current controlled according to the resistance value of said variable resistor, is output as the control signal for controlling an operation of said rise/fall control section.

5. A pulse width control circuit according to claim 1, wherein a plurality of units each constituted by said rise/fall control section and said waveform shaping section are connected in multi-stages, and an operation of said rise/fall control section of each unit is controlled according to a control signal generated by said control signal generating section.

* * * * *